(12) United States Patent
Sakamoto

(10) Patent No.: US 8,237,147 B2
(45) Date of Patent: Aug. 7, 2012

(54) SWITCHING ELEMENT AND MANUFACTURING METHOD THEREOF

(75) Inventor: Toshitsugu Sakamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 162 days.

(21) Appl. No.: 12/738,718

(22) PCT Filed: Oct. 14, 2008

(86) PCT No.: PCT/JP2008/068581
§ 371 (c)(1),
(2), (4) Date: Apr. 19, 2010

(87) PCT Pub. No.: WO2009/051105
PCT Pub. Date: Apr. 23, 2009

(65) Prior Publication Data
US 2010/0207091 A1     Aug. 19, 2010

(30) Foreign Application Priority Data

Oct. 19, 2007   (JP) ................. 2007-272699

(51) Int. Cl.
*H01L 47/00* (2006.01)
*H01L 21/332* (2006.01)
*G11C 11/00* (2006.01)

(52) U.S. Cl. ............. 257/4; 257/E45.002; 257/E21.158; 257/E21.38; 438/133; 365/153

(58) Field of Classification Search .................. 257/2, 8, 257/613, E45.002, E21.158, 4, 146, E21.38; 438/666, 1, 104, 133, 99, 134; 365/151, 365/153, 164
See application file for complete search history.

(56) References Cited

FOREIGN PATENT DOCUMENTS

| JP | 2006-339667 A | 12/2006 |
|---|---|---|
| JP | 2007-059914 A | 3/2007 |
| WO | 03/094227 A | 11/2003 |
| WO | 2005/008783 A | 1/2005 |
| WO | 2006/070693 A | 7/2006 |
| WO | 2006/070773 A | 7/2006 |
| WO | 2006/075731 A | 7/2006 |

OTHER PUBLICATIONS

International Search Report for PCT/JP2008/068581, mailed Nov. 11, 2008.

*Primary Examiner* — A. Sefer
*Assistant Examiner* — Nikolay Yushin
(74) *Attorney, Agent, or Firm* — Michael Dryja

(57) ABSTRACT

A switching element according to the present invention includes an ion-conducting layer, first electrode 11 and second electrode 12 placed in contact with the ion-conducting layer, and third electrode 15 placed in contact with the ion-conducting layer and to control electrical conductivity between the first electrode and the second electrode, wherein the shortest distance between any two of first, second, and third electrodes 11, 12, and 13 is defined by the film thickness of the ion-conducting layer.

11 Claims, 6 Drawing Sheets

US 8,237,147 B2

SWITCHING ELEMENT AND MANUFACTURING METHOD THEREOF

TECHNICAL FIELD

The present invention relates to a switching element used in reconfigurable semiconductor integrated circuits such as logical integrated circuit devices and arithmetic circuit devices and in semiconductor memory devices as well as to a manufacturing method for the switching element.

BACKGROUND ART

Examples of reconfigurable semiconductor integrated circuits include an FPGA (field-programmable gate array). The FPGA includes reconfigurable logic cells and reconfigurable interconnections and allows a user to reconfigure the FPGA by programming the logic cells and interconnections using design tools. Consequently, the user can obtain a semiconductor integrated circuit provided with desired functions in his/her own hands. The FPGA is a general-purpose component and several types of FPGA which differ in logic cell scale, peripheral circuits, and the like are available according to the purpose.

The FPGA has two advantages. The first is that since there is no need to design semiconductor integrated circuits for users, the FPGA almost eliminates the need for design and development costs tailored to specific users and initial costs for masks and the like for manufacture of integrated circuits. The second is that since there is no need to newly develop and manufacture semiconductor integrated circuits, development periods can be reduced greatly.

However, since the FPGA is equipped with switches to configure logic cells and interconnections and is provided with logic cell regions not used by the user, chip size is several tens of times larger than that of a custom-designed integrated circuit. Consequently, manufacturing costs per chip, excluding initial costs, is very high. Also, the large chip size results in long wiring length, low operating speed, and high power consumption. Therefore, when the user needs a large number of integrated circuits or high-performance integrated circuits, custom-designed integrated circuits are suitable.

The area of the switches used to reconfigure logic cells and interconnections takes up more than half the FPGA chip area and greatly affects performance and manufacturing costs of the FPGA. The switches currently in use are a type known as an SRAM switch which is a combination of an SRAM (static random-access memory) and a pass transistor. The SRAM switch has the advantage of being able to be manufactured by the same method as logic cells.

Desirably the switches used for the FPGA have a small switch area and low ON resistance. The SRAM switch has a switch area of 120F2 (where F is a minimum processing dimension of an integrated circuit) and an ON resistance of approximately 1 k ohm.

An example of switches is disclosed in JP2006-339667A (hereinafter referred to as Patent Document 1). The switch disclosed in Patent Document 1 has achieved a switch area of 8F2 and an ON resistance of approximately 100 ohms. Therefore, if the switch can be used for the FPGA, the performance of the FPGA can be improved and the manufacturing costs of the FPGA can be reduced greatly.

An FPGA using the switches disclosed in Patent Document 1 can mount a larger number of logic cells than an FPGA using SRAM switches if it is assumed that the FPGAs have the same chip size. Therefore, an application that cannot be mapped to an FPGA which uses SRAM switches due to an upper limit to the number of logic cells will be able to run on an FPGA which uses the switches disclosed in Patent Document 1.

Now, operation of the switch disclosed in Patent Document 1 will be described briefly. The switch is a three-position switch equipped with three electrodes. The switch does switching from the OFF state to ON state by forming a current path in an ion-conducting layer between the first and second electrodes. The current path connecting the two electrodes is generated and extinguished by an electrochemical reaction caused by precipitation and dissolution of copper ions, and the electrochemical reaction is controlled by the third electrode. Incidentally, the ion-conducting layer is also known as an ionic conductor or solid-electrolytic layer, but the term "ion-conducting layer" will be used hereinafter.

DISCLOSURE OF THE INVENTION

For the switch disclosed in Patent Document 1, distances among the electrodes are very important. The distance between the first and second electrodes is important because the current path is formed along the shortest distance between the first and second electrodes. The shortest distances from the first and second electrodes to the third electrode are important because the generation and extinction of the current path are controlled by the third electrode.

In a structure shown in FIG. 2 of Patent Document 1, the shortest distances from the first and second electrodes to the third electrode are determined by film thickness of the ion-conducting layer while the shortest distance between the first and second electrodes is determined by a lithography process. The film thickness of the ion-conducting layer requires a very high accuracy, specifically 1 nm or below. However, prescribed accuracy of distance provided by the lithography process is on the order of 10 nm even with leading-edge equipment.

In a structure shown in FIG. 9 of Patent Document 1, first and second electrodes are made of different materials, and a lithography process for pattern formation is performed for each electrode. Consequently, the shortest distance between the first and second electrodes might be affected by misalignment resulting from the use of different lithography processes. If the shortest interelectrode distance differs from run to run, characteristics of switching elements will vary among production lots.

An exemplary object of the present invention is to provide a switching element and a manufacturing method for the switching element, with reduced variations in characteristics among production lots.

A switching element according to an exemplary aspect of the invention includes an ion-conducting layer, a first electrode and a second electrode placed in contact with the ion-conducting layer, and a third electrode placed in contact with the ion-conducting layer, the third electrode for controlling electrical conductivity between the first electrode and the second electrode, wherein the shortest distance between any two of the first, second, and third electrodes is defined by the film thickness of the ion-conducting layer.

On the other hand, a manufacturing method for a switching element according to an exemplary aspect of the invention, which comprises a first ion-conducting layer and a second ion-conducting layer, a first electrode and a second electrode placed in contact with the first ion-conducting layer, and a third electrode placed in contact with the second ion-conducting layer in order to control electrical conductivity between the first electrode and the second electrode, includes forming the third electrode on a base, forming the second ion-conducting layer on the third electrode, forming the second electrode on the second ion-conducting layer, with a part of the second electrode covering a part of the third electrode via the second ion-conducting layer, forming the first ion-conducting layer which covers a top face of the second ion-conducting layer excluding a region of the second electrode and which covers a side face and a top face of the second electrode, and forming the first electrode on the first ion-conducting layer, with a part of the first electrode covering part of the second electrode via the first ion-conducting layer and with another part of the first electrode covering another part of the third electrode via the first and second ion-conducting layers.

DESCRIPTION OF SYMBOLS

11 First electrode
12 Second electrode
13 First ion-conducting layer
14 Second ion-conducting layer
15 Third electrode

BEST MODE FOR CARRYING OUT THE INVENTION

The configuration of a switching element according to an exemplary embodiment will be described. The switching element according to the present exemplary embodiment is a three-position switch.

Figure 1:
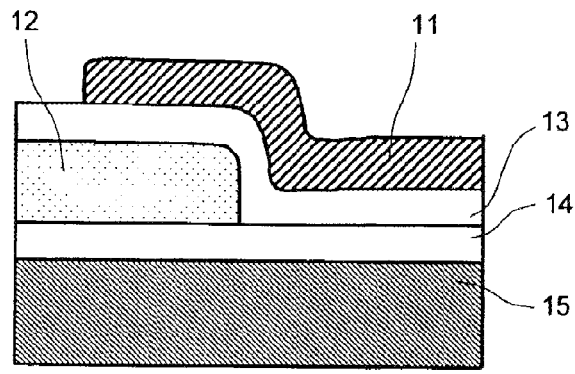
FIG. 1 is a schematic sectional view showing a configuration example of a switching element according to an exemplary embodiment.

FIG. 1 is a schematic sectional view showing a configuration example of the switching element according to the present exemplary embodiment.

As shown in FIG. 1, the switching element includes first electrode 11 and second electrode 12, first ion-conducting layer 13 placed in contact with the two electrodes, second ion-conducting layer 14 placed in contact with second electrode 12 and first ion-conducting layer 13, and third electrode 15 placed in contact with second ion-conducting layer 14. Third electrode 15 is formed on a conductive substrate (not shown).

First electrode 11 is made of a metal material capable of supplying metal ions to first ion-conducting layer 13 and second ion-conducting layer 14. Second electrode 12 is made of a material which does not supply metal ions either to first ion-conducting layer 13 or to second ion-conducting layer 14.

Second ion-conducting layer 14 is provided on third electrode 15. Second ion-conducting layer 14 has second electrode 12 formed on part of a top face and first ion-conducting layer 13 formed on the remaining region of the top face. First ion-conducting layer 13 covers the top face of second ion-conducting layer 14 excluding the part covered by second electrode 12 as well as covers a side face and a top face of second electrode 12. Consequently, first ion-conducting layer 13 covers an elevation formed by an outer periphery of a pattern of second electrode 12. As shown in FIG. 1, since the shape of second electrode 12 is reflected in first ion-conducting layer 13, an elevation is produced on first ion-conducting layer 13 by the outer periphery of second electrode 12.

First electrode 11 is provided on first ion-conducting layer 13. First electrode 11 covers the outer periphery of second electrode 12 via first ion-conducting layer 13. Consequently, first electrode 11 is formed so as to cover the elevation on first ion-conducting layer 13, with the elevation transferred with the pattern of second electrode 12.

In the configuration shown in FIG. 1, part of second electrode 12 covers part of third electrode 15 via second ion-conducting layer 14, and the shortest distance between second electrode 12 and third electrode 15 is determined by film thickness of second ion-conducting layer 14.

Part of first electrode 11 covers part of second electrode 12 via first ion-conducting layer 13. Consequently, the shortest distance between first electrode 11 and second electrode 12 is determined by the film thickness of first ion-conducting layer 13. Also, the other part of first electrode 11 covers part of third electrode 15 via a film stack of first ion-conducting layer 13 and second ion-conducting layer 14. Consequently, the shortest distance between first electrode 11 and third electrode 15 is defined by the sum of film thicknesses of first ion-conducting layer 13 and second ion-conducting layer 14.

Thus, according to the present exemplary embodiment, the shortest distance between any two of the electrodes is defined by the film thickness(es) of one or more ion-conducting layers, making it possible to reduce variations in the characteristics of the switching element among production lots.

Referring to FIG. 1, first ion-conducting layer 13 rises from top of second ion-conducting layer 14 along a side wall of the pattern of second electrode 12 by bending at an angle of 90 degrees. Following the shape of the bend, first electrode 11 also rises in a vertical direction from a horizontal direction parallel to a substrate surface by bending at an angle of nearly 90 degrees. Consequently, first electrode 11 has a cross-sectional shape in which the bent portion tends to be pointed toward second electrode 12.

To make the bent portion of first electrode 11 pointed more sharply toward second electrode 12, it is advisable to form first ion-conducting layer 13 using a sputtering process.

Figure 2:
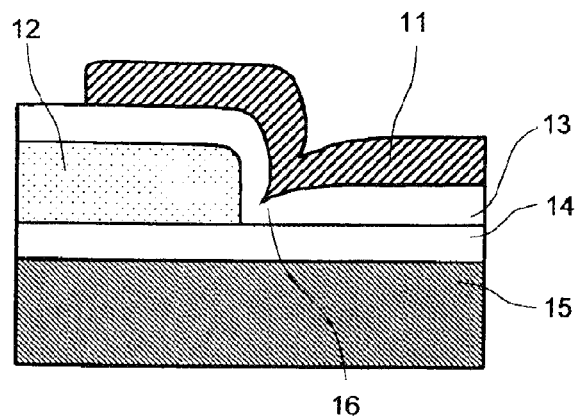
FIG. 2 is a schematic sectional view showing an ion-conducting layer formed by a sputtering process.

FIG. 2 is a schematic sectional view showing an ion-conducting layer formed by the sputtering process. The sputtering process is a film formation method which hurls argon ions against an electrode material called a target, thereby dislodging particles of the electrode material from a substrate surface, and deposits the particles on the substrate surface. In the sputtering process, the film deposition rate has anisotropy unlike in a CVD (Chemical Vapor Deposition) process: the deposition rate is lower on the side wall than on the flat part.

Looking at a film formation process on the side wall of the pattern provided on the substrate surface, the film in the process of formation on the side wall acts as a shield against particles which will come to the side wall in mid-flow as formation of the film. Therefore, the lower the location on the side wall, the lower the deposition rate. Consequently, as shown in FIG. 2, the film thickness of first ion-conducting layer 13 becomes smaller near the junction between the top face of second ion-conducting layer 14 and second electrode 12 than in the other region. First electrode 11 formed on first ion-conducting layer 13 has sharp portion 16 as shown in FIG. 2 in the bent portion of first ion-conducting layer 13. It can be seen that in the cross-sectional shape shown in FIG. 2, sharp portion 16 is more acute with a smaller angle than the bent portion of first electrode 11 shown in FIG. 1.

Next, operation of the switching element according to the present exemplary embodiment will be described.

Operation of the switching element according to the present exemplary embodiment is basically the same as that of the three-position switch disclosed in Patent Document 1, and thus the operation will be described briefly here.

First, description will be given of a case in which a switch is turned from OFF to ON by the application of a voltage between two electrodes—between first electrode 11 and second electrode 12. When a positive voltage is applied to first electrode 11 with respect to second electrode 12, metal of first electrode 11 ionizes and the resulting metal ions dissolve into an ion-conducting layer. Then, metal ions contained in first ion-conducting layer 13 are precipitated as metal in the ion-conducting layer, and the precipitated metal forms a metal bridge to interconnect first electrode 11 and second electrode 12. When first electrode 11 and second electrode 12 are electrically interconnected by the metal bridge, the switch is turned on.

A location where the metal bridge is formed will be described with reference to FIG. 1.

When one of the two electrodes is grounded and a voltage is applied to the other electrode, the electric field strength generated between the two electrodes is inversely proportional to the square of the distance between the electrodes. The metal bridge is formed along the shortest distance between the two electrodes, i.e., in a location where the electric field strength is the highest. Now, looking at a cross-sectional shape of first electrode 11 shown in FIG. 1, the bent portion is pointed more sharply toward second electrode 12 than in the other region. When a voltage is applied between first electrode 11 and second electrode 12, an electric field is concentrated on the sharp part of first electrode 11. Consequently, ion conductivity of the metal ions increases, causing a metal bridge to suitably grow in this part.

Next, a case in which a switch is turned from ON to OFF will be described.

In an ON state, when a positive voltage is applied to first electrode 11 and second electrode 12 with respect to third electrode 15, the metal of the metal bridge ionizes and the resulting metal ions dissolve into first ion-conducting layer 13 and second ion-conducting layer 14. When part of the metal bridge is cut off as a result of the dissolution, the switch is turned off.

In this case, the switch can be turned from ON to OFF easily if one of the following methods is used. A first method involves creating a potential difference between first electrode 11 and second electrode 12 to facilitate the cutoff of the metal bridge. If the electrical potential of second electrode 12 is raised higher than the electrical potential of first electrode 11, metal ions are pulled out of the metal bridge in the direction of first electrode 11 as well, facilitating cutoff of the metal bridge.

A second method involves making the ambient temperature higher than room temperature to facilitate movement of metal ions, thereby facilitating cutoff of metal bridge 10. At around 150° C., the diffusion rate of metal ions increases. The first and second methods, if used together, will prove more effective.

After the switch is turned off using one of the methods described above, a bridge can be formed again between the two electrodes on the same principle as the switch transition from ON to OFF by the application of a positive voltage to first electrode 11 with respect to second electrode 12. In this case, since the switch is turned on after part of the metal bridge once formed is cut off, a shorter time and lower applied voltage is required in order to turn on the switch than when switching has never been done.

Next, description will be given of a method for turning a switch from OFF to ON when third electrode 15 is made of a metal material capable of supplying metal ions to first ion-conducting layer 13 and second ion-conducting layer 14. In this case, a metal bridge is once formed between first electrode 11 and second electrode 12 by switching. Subsequently, the switch is turned off by cutting off part of the metal bridge, and then turned on.

A positive voltage is applied to first electrode 11 and second electrode 12 with respect to third electrode 15. Consequently, the metal of third electrode 15 ionizes and the resulting metal ions move to second electrode 12, first electrode 11, and the metal bridge and deposit thereon as metal. Since the metal bridge has been cut off after being formed once, as described above, the chipped portion of the metal bridge has been limited to a minimum. Consequently, if only metal is deposited in the chipped portion, a metal bridge joining first electrode 11 and second electrode 12 is formed, interconnecting first electrode 11 and second electrode 12.

Even if an electrical connection is not broken or completely short-circuited, changes in electrical characteristics, such as changes in electrical resistance between the first and second electrodes or changes in interelectrode capacitance, may be sensed and used for switching or memory actions. According to the present invention, switching operation is regarded as changes in electrical conductivity including the changes just described.

Also, although it has been stated in the present exemplary embodiment that first electrode 11 is made of a material which supplies metal ions, it is only necessary that at least that part of first electrode 11 which is placed in contact with ion-conducting layers contain a material which supplies metal ions to the ion-conducting layers. The same applies to third electrode 15. Also, although it has been stated that second electrode 12 is made of a material which does not supply metal ions, it is only necessary that at least that part of second electrode 12 which is placed in contact with ion-conducting layers be made of a material which does not supply metal ions.

Example 1

A configuration of a switching element according to example 1 will be described.

Regarding electrode materials, in the configuration shown in FIG. 1, the switching element according to the present example used copper for first electrode 11, a film stack of platinum and titanium for second electrode 12, and platinum for third electrode 15. Regarding materials for ion-conducting layers, ditantalum pentoxide was used for first ion-conducting layer 13 and second ion-conducting layer 14.

Next, a manufacturing method for the switching element according to the present example will be described.

A laminated structure of platinum and titanium (50 nm and 5 nm in film thickness) is formed on a conductive silicon substrate by a vacuum deposition process and is used as third electrode 15. A film of ditantalum pentoxide 20 nm in thickness is formed on third electrode 15 by the sputtering process and used as second ion-conducting layer 14.

Next, second ion-conducting layer 14 is spin-coated with an LOR resist (made by Kayaku MicroChem Corp.) and electron beam resist (PMMA: made by Kayaku MicroChem Corp.) in sequence and subjected to post-baking. The LOR resist and PMMA resist are developed by being exposed to an electron beam, and an opening pattern that is to be used for forming second electrode 12 is formed in the resists. Then, platinum and titanium thin films (20 nm and 2 nm in film thickness) are formed by the vacuum deposition process on the resists having the opening pattern. Subsequently, the resists are dissolved with an organic solvent to remove unnecessary metal films, and a laminated structure of platinum and titanium (20 nm and 2 nm in film thickness) is formed as second electrode 12. This method of removing resists together with metal films deposited thereon is known as a liftoff process.

Furthermore, first ion-conducting layer 13 and first electrode 11 are formed as follows, using a lithography step including resist coating, exposure, and developing, a film formation step based on the vacuum deposition process, and a liftoff step, such as described above.

Second ion-conducting layer 14 with second electrode 12 formed on part of the top face is spin-coated with an LOR resist (made by Kayaku MicroChem Corp.) and electron beam resist (PMMA: made by Kayaku MicroChem Corp.) in sequence and subjected to post-baking. The LOR resist and PMMA resist are developed by being exposed to an electron beam, and an opening pattern is formed in the resists.

When the LOR resist is developed, the developing time is controlled to make the opening area of the LOR resist a size larger than the opening area of the PMMA resist. Consequently, eaves of a predetermined length are formed inward from the periphery of an opening pattern of the LOR resist by the PMMA resist.

After the opening pattern is formed in the resists, a film of ditantalum pentoxide 20 nm in thickness is formed thereon by the sputtering process. In this film formation step, ditantalum pentoxide is also deposited under the eaves of PMMA resist. Next, copper is deposited on the ditantalum pentoxide by the vacuum deposition process. Subsequently, unnecessary part of ditantalum pentoxide and copper is removed by the liftoff process, thereby forming first ion-conducting layer 13 of ditantalum pentoxide and first electrode 11 of copper.

Since ditantalum pentoxide is also deposited under the eaves of PMMA as described above, the pattern of first ion-conducting layer 13 becomes a size larger than the pattern of first electrode 11 with first ion-conducting layer 13 sticking out of first electrode 11. This structure improves the dielectric strength between first electrode 11 and second electrode 12. If a side wall of the pattern of first electrode 11 coincides in position with a side wall of the pattern of first ion-conducting layer 13, a leak path will be created, causing an electric current to flow between the electrodes through the side wall of first ion-conducting layer 13. By making the pattern of first ion-conducting layer 13 larger than that of first electrode 11, it is possible to prevent the occurrence of a leak path.

The structure of the switching element fabricated by the above-described manufacturing method will be described.

Figure 3A:
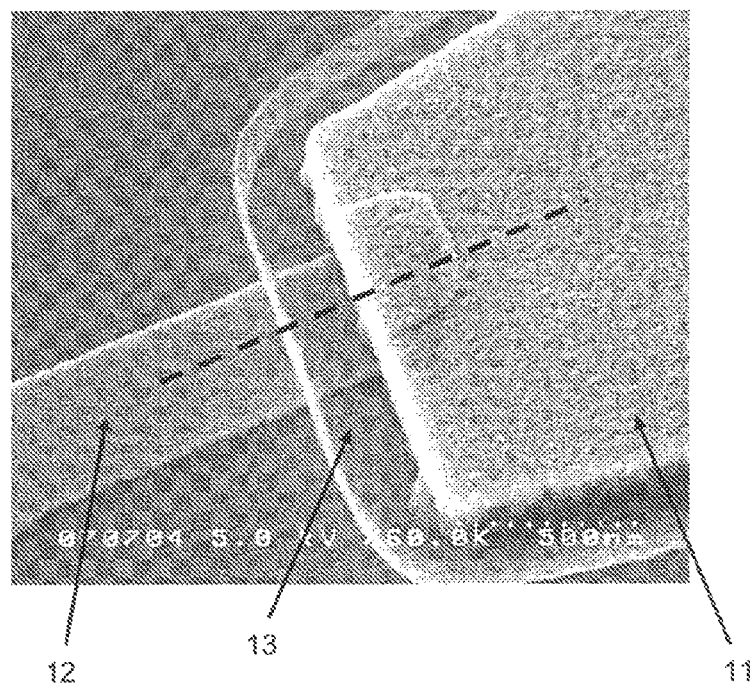
FIG. 3A is an electron micrograph showing a configuration example of a switching element according to example 1.
Figure 3B:
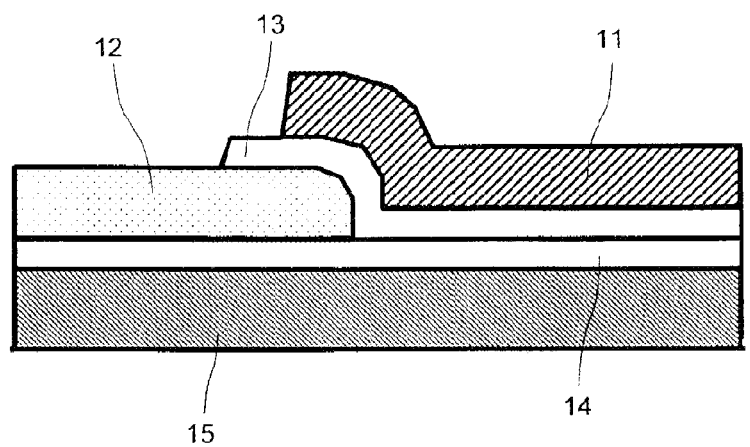
FIG. 3B is a schematic sectional view showing a configuration example of the switching element according to example 1.

FIG. 3A is an electron micrograph of the switching element according to the present example. FIG. 3B is a schematic sectional view taken along a broken line in FIG. 3A.

FIG. 3A is a photograph taken of the switching element obliquely from above. According to the present example, the pattern of second electrode 12 is rectangular. First ion-conducting layer 13 is formed covering part of second electrode 12. The pattern of first ion-conducting layer 13 is quadrangular, and sides parallel to the short sides of second electrode 12 are longer than the short sides of second electrode 12.

First electrode 11 is formed on first ion-conducting layer 13. The pattern of first electrode 11 is also quadrangular, and sides parallel to the short sides of second electrode 12 are longer than the short sides of second electrode 12 and shorter than first ion-conducting layer 13. This is because the pattern of first ion-conducting layer 13 is a size larger than that of second electrode 12 as described in relation to the manufacturing method.

Looking at a top face of first electrode 11 shown in FIG. 3A, it can be seen that a part covering second electrode 12 via first ion-conducting layer 13 protrudes above the other region. This is because the elevation caused by the pattern of second electrode 12 is transferred to first electrode 11 via first ion-conducting layer 13.

Next, operation of the switching element will be described. The switching element according to the present example is a three-position switch which performs an ON/OFF operation. When the switching element is viewed in terms of a MOS (Metal Oxide Semiconductor) transistor, first electrode 11 corresponds to a source electrode of the MOS transistor, second electrode 12 corresponds to a drain electrode, and third electrode 13 corresponds to a gate electrode.

First, a case in which the switch is turned from OFF to ON will be described. When second electrode 12 and third electrode 15 are grounded and a positive voltage is applied to first electrode 11, the copper of first electrode 11 ionizes and the resulting copper ions dissolve into first ion-conducting layer 13. Then, the copper ions contained in first ion-conducting layer 13 precipitate as metal in the first ion-conducting layer and the precipitated metal forms a copper bridge to interconnect first electrode 11 and second electrode 12. When first electrode 11 and second electrode 12 are electrically interconnected by the copper bridge, the switch turns on.

Next, a case in which the switch is turned from ON to OFF will be described. When a negative voltage is applied to first electrode 11, the copper of the copper bridge ionizes and the resulting copper ions dissolve into first ion-conducting layer 13 and second ion-conducting layer 14. When part of the copper bridge is cut off as a result of the dissolution, the switch turns off.

Next, electrical characteristics of the switching element according to the present example will be described.

Figure 4:
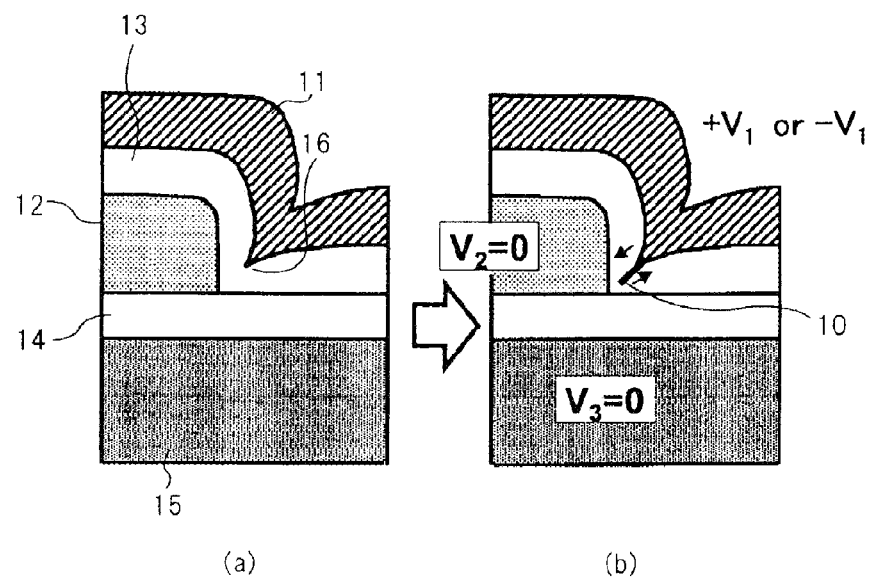
FIG. 4 is a sectional view schematically showing operating principles of the switching element according to example 1.

FIG. 4 is a sectional view schematically showing operating principles of the switching element. The switching element shown in FIG. 2 will be described here to make it easier to understand the growth and cutoff of a copper bridge.

Figure 5:
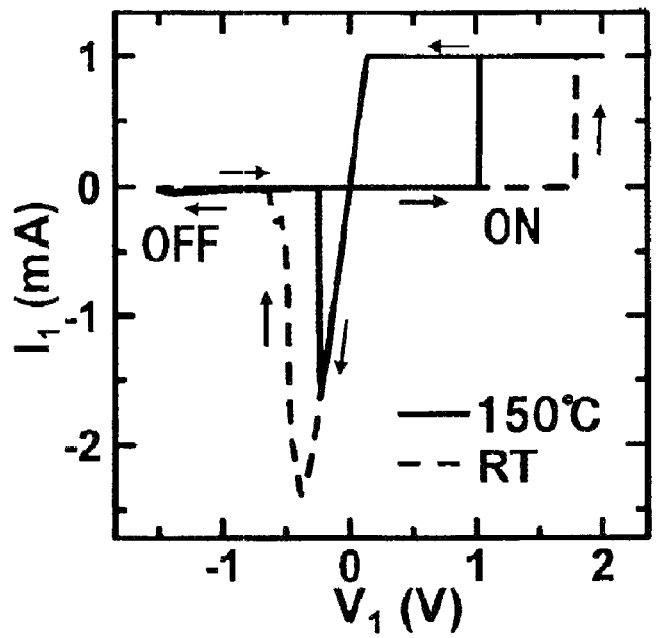
FIG. 5 is a graph showing electrical characteristics of the switching element according to example 1.

FIG. 5 is a graph showing voltage-current characteristics of the switching element. The graph in FIG. 5 shows a relationship between a voltage applied to first electrode 11 and a current flowing through first electrode 11. The abscissa represents a voltage V1 applied to first electrode 11 and the ordinate represents current I1 flowing through first electrode 11. Voltage-current characteristics were measured under two conditions: in the first condition, ambient temperature during measurement was set to room temperature (approximately 20° C.) and in the second condition, the ambient temperature was 150° C. In FIG. 5, measurement data obtained at room temperature is represented by a broken line and measurement data obtained at 150° C. is represented by a solid line.

In an OFF state shown in FIG. 4(a), second electrode 12 and third electrode 15 are grounded and a positive voltage is applied to first electrode 11. As the positive voltage applied to first electrode 11 is increased gradually, the electric field strength between first electrode 11 and second electrode 12 becomes highest in sharp portion 16 shown in FIG. 4(a). Consequently, copper tends to precipitate in sharp portion 16. As shown in FIG. 4(b), copper bridge 10 extends to second electrode 12, interconnecting first electrode 11 and second electrode 12 at the copper bridge 10. In this way, the element is turned on.

In the ON state, when a negative voltage is applied to first electrode 11 and the absolute value of the voltage is increased gradually, the copper of copper bridge 10 dissolves into the ion-conducting layer, cutting off copper bridge 10 as shown in FIG. 4(b). In this way, the element is turned off. Description will be given below of how voltage-current characteristics change as a result of each state transition.

Looking at the voltage-current characteristics at ambient temperature equal to room temperature in the graph of FIG. 5, when the positive voltage applied to first electrode 11 is increased from 0 V, the current increases from 0 A to 1 mA at around 2V. At this point, first electrode 11 and second electrode 12 become interconnected by copper bridge 10. During measurement, measured current is controlled so as not to exceed 1 mA.

Even if the voltage applied to first electrode 11 is returned to 0 V, the ON state is maintained. Furthermore, when the absolute value of a negative voltage applied to first electrode 11 is increased, the absolute value of the current decreases at around −0.5 V, causing a transition to an OFF state.

On the other hand, looking at the voltage-current characteristics at ambient temperature equal to 150° C. in the graph of FIG. 5, the voltage during transition from the OFF state to ON state is approximately 1 V and the voltage during transition from the ON state to OFF state is approximately −0.2 V.

It can be seen from the graph in FIG. 5 that when the ambient temperature of the switching element is high, the absolute value of the voltage during switching is lower. This is because high temperatures increase the diffusion rate of copper ions, facilitating the phenomena of the copper bridge being connected and cut off.

Next, description will be given of a case in which the switching element is caused to transition from the ON state to OFF state by the application of a voltage to third electrode 15.

Figure 6:
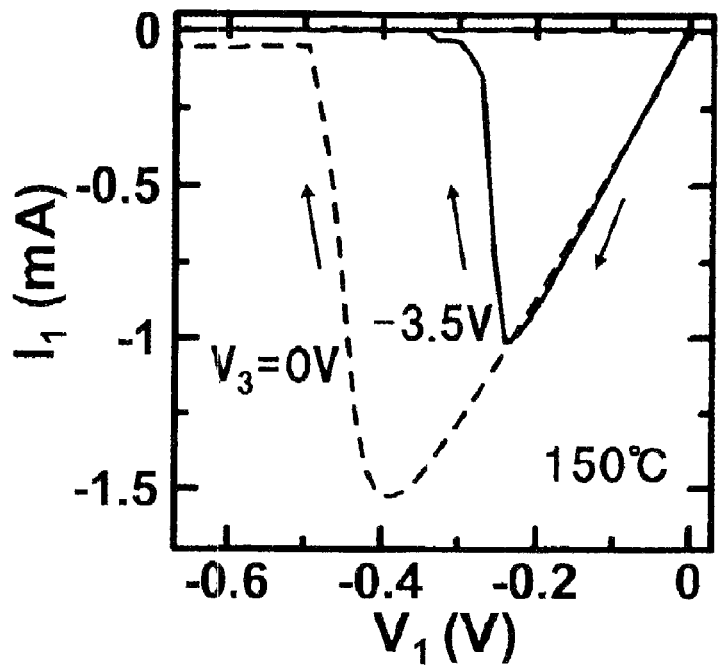
FIG. 6 is a graph showing electrical characteristics when the switching element according to example 1 transitions from ON state to OFF state.

FIG. 6 is a graph showing voltage-current characteristics when the switching element transitions from the ON state to OFF state. The abscissa represents a voltage V1 applied to first electrode 11 and the ordinate represents current I1 flowing through first electrode 11.

Third electrode 15 and second electrode 12 of the switching element in an ON state are grounded and a negative voltage is applied to first electrode 11. It can be seen that when the absolute value of the negative voltage applied to first electrode 11 is increased gradually, as with the measurement shown in the graph of FIG. 5, the switching element turns off at around −0.4 V as indicated by a broken line in FIG. 6.

On the other hand, to change the switching element from the ON state to OFF state, a negative voltage of −3.5 V is applied to third electrode 15 instead of grounding third electrode 15. The voltage applied to third electrode 15 is denoted by V3. In this state, when the negative voltage applied to first electrode 11 is changed from 0 V, it can be seen that the switching element turns off at around −0.2 V as indicated by a solid line in FIG. 6.

In this way, when a negative voltage is applied to third electrode 15, voltage V1 required for transition from the ON state to OFF state changes from −0.4 V to −0.2V, meaning a decrease in absolute value. Also, the current that flows during switching is reduced by approximately 0.5 mA.

Figure 7:
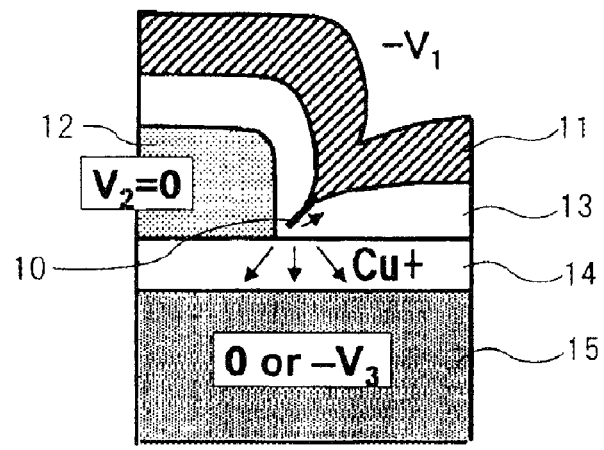
FIG. 7 is a schematic sectional view for illustrating operating principles of the switching element in relation to the voltage-current characteristics shown in FIG. 6.

FIG. 7 is a schematic sectional view for illustrating operating principles of the switching element in relation to the voltage-current characteristics shown in FIG. 6. Again, the switching element shown in FIG. 2 is used in the following description.

During transition from the ON state to OFF state, if a negative voltage is applied not only to first electrode 11, but also to third electrode 15, copper is pulled out as copper ions toward both first electrode 11 and second electrode 12 from copper bridge 10 interconnect first electrode 11 and second electrode 12. Consequently, the voltage during switching is lower than when a voltage is applied only to first electrode 11 (measurement data indicated by a broken line in FIG. 6).

Example 2

In the present example, the switching element according to the present exemplary embodiment is mounted on a semiconductor apparatus. It is assumed that the third electrode contains a material capable of supplying metal ions.

In relation to mounting of the switching element according to the present exemplary embodiment on a semiconductor apparatus, a base on which the switching element can be formed will be described.

A semiconductor substrate with active elements and the like functionally required for the semiconductor device mounted thereon may be used as a base.

Alternatively, a semiconductor substrate whose surface is covered with an insulating film may be used as a base. In this case, active elements formed on the surface of the semiconductor substrate may be covered with the insulating film. Furthermore, a semiconductor substrate with a multilayer interconnection structure formed thereon may be used as a base, where the multilayer interconnection structure is made up of interlayer insulating films and interconnections. In this way, the switching element according to the present exemplary embodiment can be formed on various types of base.

In particular, when the switching element according to the present exemplary embodiment is used as a switch for a reconfigurable circuit, a structure in which a multilayer interconnection is mounted on a semiconductor substrate can suitably be used as a base. This structure is not limited to a case in which the switching element according to the present exemplary embodiment is mounted on a top layer of a base containing a multilayer interconnection. The switching element formed on a base containing multilayer interconnections may be coated with an interlayer insulating film and an interconnection may be formed thereon. This structure allows the switching element according to the present exemplary embodiment to be buried in a multilayer interconnection structure of a semiconductor device.

Figure 8:
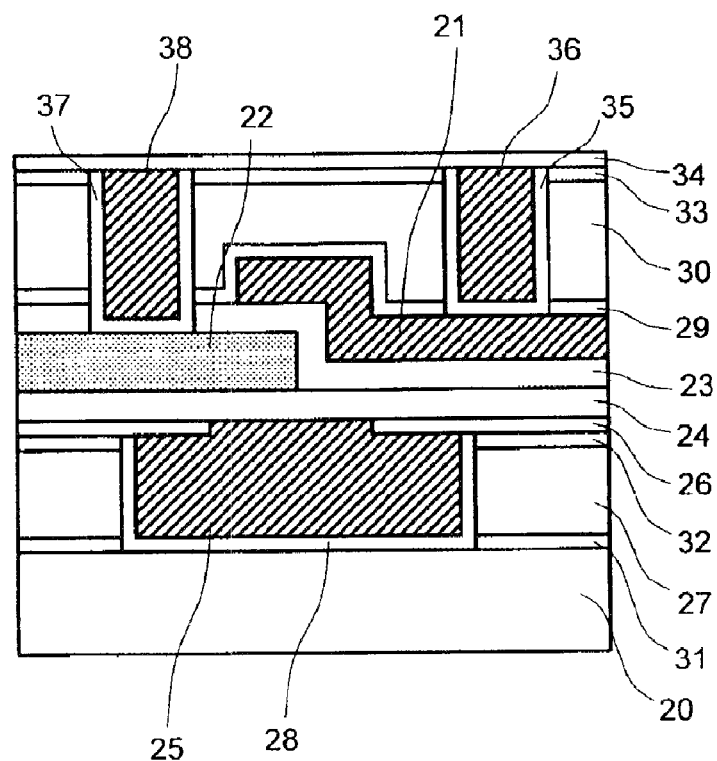
FIG. 8 is a schematic sectional view showing a configuration example of a switching element according to example 2.

Next, a structure in which the switching element according to the present exemplary embodiment is mounted on a semiconductor apparatus will be described. FIG. 8 is a schematic sectional view showing a configuration example in which the switching element is mounted on a semiconductor apparatus.

The semiconductor apparatus according to the present example includes a multilayer interconnection structure (not shown) that is used to connect semiconductor elements (not shown) as well as includes the switching element. The multilayer interconnection structure is provided on the base while the switching element is formed in the same layer as part of the multilayer interconnection structure or on the multilayer interconnection structure.

As shown in FIG. 8, the switching element includes first electrode 21, second electrode 22, third electrode 25, first ion-conducting layer 23, and second ion-conducting layer 24, as in the case of the configuration shown in FIG. 1. First electrode 21 and third electrode 25 contain a material capable of supplying metal ions. First plug 36 is connected with first electrode 21 via first barrier metal 35 and second plug 38 is connected with second electrode 22 via second barrier metal 37. The configuration shown in FIG. 8 will be described in detail below.

A silicon substrate (not shown) with semiconductor elements (not shown) and an insulating film formed thereon is used as base 20, the insulating film covering the semiconductor elements. First stop insulating film 31, first interlayer insulating layer 27, second stop insulating layer 32, and first anti-diffusion layer 26 are formed in this order on base 20. An interconnection (not shown) and third electrode 25 are formed in a wiring groove in a laminate of these films.

A bottom face and side faces of third electrode 25 are covered by third barrier metal 28. A top face of third electrode 25 is covered by first anti-diffusion layer 26 in which an opening is provided. Second ion-conducting layer 24 is provided on first anti-diffusion layer 26. Part of the top face of third electrode 25 is placed in contact with second ion-conducting layer 24 through the opening in first anti-diffusion layer 26. The opening restricts the diffusion area of metal ions to prevent diffusion of extra metal ions from third electrode 25 to second ion-conducting layer 24. Desirably, the opening is smaller in area than the top face of third electrode 25 as shown in FIG. 8.

Description will be given of the reason why third electrode 25 is covered by the anti-diffusion layer or barrier metal except for the part placed in contact with second ion-conducting layer 24.

From the standpoint of using the phenomenon of elution, i.e., elution of metal ions from third electrode 25 to second ion-conducting layer 24, it is necessary in principle that third electrode 25 be placed in contact with second ion-conducting layer 24. However, it is not desirable that third electrode 25 contact the insulating film of base 20 or first interlayer insulating layer 27. Because, if metal is eluted to the insulating film and to first interlayer insulating layer 27, the eluted metal will deteriorate the dielectric strength of the insulators. Therefore, as shown in FIG. 8, third electrode 25 is kept from direct contact with the insulating film on the top face of base 20 and from first interlayer insulating layer 27 by being covered by third barrier metal 28 aid first anti-diffusion layer 26 except for the part placed in contact with second ion-conducting layer 24. In this way, the barrier metal and first anti-diffusion layer block out metal ions eluted from third electrode 25.

A pattern of second ion-conducting layer 24 is plate-shaped. This makes it possible to more accurately control the distance between second electrode 22 and third electrode 25 in the lithography step, improving controllability of voltage that is applied during switching. On the other hand, the shortest distance between third electrode 25 and second electrode 22 may be changed intentionally by curving second ion-conducting layer 24 three-dimensionally or by forming projections and depressions on boundaries of third electrode 25 and second electrode 22. For example, if the shortest distance between third electrode 25 and second electrode 22 is reduced, switching operation can be performed at a lower voltage.

Desirably, second ion-conducting layer 24 covers the entire opening of first anti-diffusion film 26. More desirably, the pattern of second ion-conducting layer 24 is formed above first interlayer insulating layer 27 outside the pattern of third electrode 25. When the pattern of second ion-conducting layer 24 is increased in this way, second ion-conducting layer 24 becomes more effective in preventing diffusion of metal ions in the left-right direction in FIG. 8. At the same time, this provides the advantage of improving long-term reliability of the semiconductor apparatus.

Second electrode 22 is provided on second ion-conducting layer 24. The pattern and shape of second electrode 22 will be described. When viewed vertically from above base 20, the pattern of second electrode 22 partially overlaps the opening of first anti-diffusion layer 26. Consequently, part of second electrode 22 partially overlaps the pattern of third electrode 25 via second ion-conducting layer 24. Desirably, as shown in FIG. 8, an edge of the pattern of second electrode 22 is located near the center of third electrode 25 showing through the opening. This prevents the edge of the pattern of second electrode 22 from getting out of the opening in the event of any misalignment in the lithography step. Also, as shown in FIG. 8, the area of the pattern of second electrode 22 is large enough to form a plug for electrical connection on a top face of second electrode 22.

As shown in FIG. 8, first ion-conducting layer 23 covers a top face of second ion-conducting layer 24 excluding a region in which second electrode 22 is formed. Also, first ion-conducting layer 23 covers a side face of second electrode 22 and the top face of second electrode 22 excluding regions used for electrical connection.

If first ion-conducting layer 23 is formed by the sputtering process, the film thickness of first ion-conducting layer 23 varies from place to place depending on the shape of the underlying layer. The film formed on the side face of the pattern of second electrode 22 tends to be thinner than the film formed on the top face of second electrode 22. Also, near the side face of the pattern of second electrode 22, the film formed on the top face of second ion-conducting layer 24 tends to become thinner than the film formed on the top face of second electrode 22.

First electrode 21 is provided on first ion-conducting layer 23. As shown in FIG. 8, an elevation on second ion-conducting layer 24 caused by the pattern of second electrode 22 is transferred to first ion-conducting layer 23, and first electrode 21 is formed astride part of the resulting elevation on first ion-conducting layer 23. The sharp portion such as shown in FIG. 2 is formed on that part of first electrode 21 which covers the elevation on first ion-conducting layer 23.

The side faces of first electrode 21 are covered by second anti-diffusion layer 29 and the top face of first electrode 21 is covered by second anti-diffusion layer 29 except for regions used for electrical connection. The reason why the side faces and top face of first electrode 21 are covered by second anti-diffusion layer 29, except for regions used for electrical connection, is to prevent elution of metal ions from first electrode 21 into interlayer insulating films as in the case of third electrode 25.

Second interlayer insulating layer 30 is provided on second anti-diffusion layer 29. Third stop insulating layer 33 is provided on second interlayer insulating layer 30. Second plug 38 whose side faces and bottom face are covered by second barrier metal 37 is provided in a hole which reaches the top face of second electrode 22 by penetrating first ion-conducting layer 23, second anti-diffusion layer 29, second interlayer insulating layer 30, and third stop insulating layer 33. Also, first plug 36 whose side faces and bottom face are covered by first barrier metal 35 is provided in a hole which reaches the top face of first electrode 21 by penetrating second anti-diffusion layer 29, second interlayer insulating layer 30, and third stop insulating layer 33. Protective film 34 which covers the top faces of first plug 36 and second plug 38 is provided on third stop insulating layer 33.

First plug 36 is a part used to provide an electrical connection for first electrode 21 while second plug 38 is a part used to provide an electrical connection for second electrode 22. The reason why first plug 36 is covered by first barrier metal 35 and protective film 34 is to prevent metal material of the plug from diffusing into second interlayer insulating layer 30. Second plug 38 is covered by second barrier metal 37 and protective film 34 for the same reason as first plug 36.

First stop insulating layer 31, second stop insulating layer 32, third stop insulating layer 33, and protective film 34 are films required for manufacture of the switching element rather than for functioning of the switching element. The major roles of these films will be described later in relation to the manufacturing method.

Next, suitable materials for the main parts of the switching element in the semiconductor apparatus shown in FIG. 8 will be described.

A suitable material for first ion-conducting layer 23 and second ion-conducting layer 24 is a compound of a metal or semiconductor having a chalcogen element such as oxygen, sulfur, selenium, or tellurium. In particular, suitable materials include sulfides and oxides containing at least one metal selected from copper, tungsten, tantalum, molybdenum, chromium, titanium, and cobalt on the periodic table of elements as well as oxysulfides having an arbitrary sulfur-oxygen ratio.

From the standpoint of mounting the switching element on a semiconductor device, a suitable material for first ion-conducting layer 23 and second ion-conducting layer 24 is a metal oxide, especially tantalum oxide ($Ta_2O_5$) or titanium oxide ($TiO_2$). The first reason is that metal oxides are already used in the semiconductor device and have high compatibility with semiconductor device processes. A second reason is that when the switching element is used as a switch for a reconfigurable circuit, if a metal oxide is used for ion-conducting layers, the switching voltage can be made higher than the logic operation voltage. By making the switching voltage higher than the logic operation voltage, it is possible to increase endurance for repeated operations and ensure high reliability.

Film thicknesses of first ion-conducting layer 23 and second ion-conducting layer 24 can be set in a range of approximately 5 to 200 nm, but desirably the film thicknesses are set, in particular, in a range of 10 to 100 nm. A film thickness of 10 nm or below tends to cause leakage current at switch-off due to tunnel current or Schottky current. On the other hand, a film thickness of 100 nm or above will result in a switching voltage of 10 V or above, and is not practical for use in a semiconductor device and the like.

Each of the ion-conducting layers are typically made of a single-layer film, but may be made of a laminated structure of two or more films which differ in ion-conducting characteristics or electrical characteristics. The use of a laminated structure makes it possible to control switching voltage (threshold voltage) as well as leakage characteristics at switch-off.

First electrode 21 and third electrode 25 contain a material capable of supplying metal ions to first ion-conducting layer 23 and second ion-conducting layer 24. Therefore, a metal or alloy which contains at least one from among copper (Cu), silver, and lead as a major constituent is used for these electrodes. In particular, in terms of compatibility with semiconductor device processes, the major constituent is desirably Cu.

Also, the metal or alloy only needs to exist in at least part of that face of first electrode 21 which is in contact with first ion-conducting layer 23 and in at least part of that face of third electrode 25 which is in contact with second ion-conducting layer 24. Therefore, first electrode 21 and third electrode 25 are not limited to a single-layer structure such as shown in FIG. 8, and the layer in contact with the ion-conducting layer may have a laminated structure of a layer made of material such as Cu that is capable of supplying metal ions and a layer made of another material. Alternatively, the surface in contact with the ion-conducting layer may be a composite surface of a metal such as Cu that is capable of supplying metal ions and a metal which does not supply metal ions.

Metal which contains Cu as a major constituent is used suitably for at least that part of third electrode 25 which supplies metal ions to second ion-conducting layer 24. Cu is formed by an electrolytic plating process, and a copper shield layer is provided to uniformly supply current needed for the plating or for increasing adhesion to the barrier metal. The shield layer contains trace amounts of metal impurities such as aluminum for the purpose of increasing electromigration resistance. The Cu film formed by this technique contains metal impurities such as aluminum in its undersurface, and a high concentration of impurities in a film (near the undersurface) produced in the early stage of film formation.

In this way, Cu which performs the function of supplying metal ions can be provided in an electrode (third electrode 25) located under second ion-conducting layer 24. When Cu film is formed by a plating process, an upper layer of the film contains higher-purity copper than a lower layer. Thus, if the top face of the Cu film is used as an ion supply source, an electrode capable of supplying high-purity metal ions can be realized.

A conductive material which is less prone to receive metal ions from the ion-conducting layers is used for second electrode 22. Specifically, suitable materials include high-melting-point metals such as platinum, aluminum, gold, titanium, tungsten, nickel, palladium, tantalum, chromium, and molybdenum; a nitride of at least one of these metals; a silicide of at least one of these metals; and an alloy of two or more of these metals.

Regarding second electrode 22, it is only necessary that at least the face of second electrode 22 which is placed in contact with the ion-conducting layers be made of any of the materials described above. Therefore, second electrode 22 is not limited to a single-layer structure such as shown in FIG. 8, and the layer in contact with the ion-conducting layer may have a laminated structure of a layer made of material which does not receive metal ions and a layer made of another material.

Second anti-diffusion layer 29 and first anti-diffusion layer 26 are made of a material which prevents diffusion of metal species liable to cause dissolution or precipitation in the ion-conducting layers during operation of the switching element. For example, when Cu is used for first electrode 21 and third electrode 25, an insulating film containing nitrogen can be used suitably, including, in particular, a silicon nitride film and silicon oxynitride film, which may contain an arbitrary amount of carbon (silicon carbonitride). Regarding the film thicknesses of second anti-diffusion layer 29 and first anti-diffusion layer 26, although anti-diffusion capacity varies depending on the material used, a film thickness of about 2 nm or above serves the purpose of anti-diffusion and 5 nm or above is sufficient.

When the "insulating film containing nitrogen" described above is used, since the film has a relatively high dielectric constant, it is desirable to minimize film thickness to the extent that the anti-diffusion capability can be ensured. Specifically, it is desirable that an upper limit of the film thickness be around 200 nm. The reason why a low dielectric constant is desirable is that a high dielectric constant will increase interwire capacitance, resulting in slow circuit operation.

Material for second interlayer insulating layer 30 and first interlayer insulating layer 27 may be selected from the materials already used in the semiconductor device. For example, a silicon oxide or an organic or inorganic material having a low dielectric constant can be used suitably.

Next, the manufacturing method for the switching element according to the present example will be described. FIGS. 9A to 9E are schematic sectional views showing the manufacturing method for the switching element according to the present example. For the purposes of description, the manufacturing method is broadly divided into six steps.

Figure 9A:
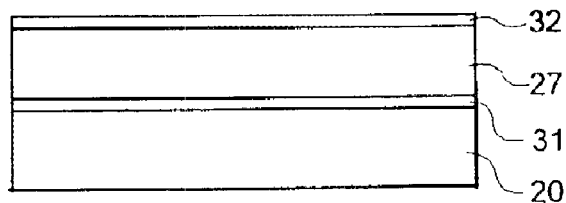
FIG. 9A is a schematic sectional view showing a manufacturing method for the switching element according to example 2.

[Step 1] Base 20 is prepared by forming semiconductor elements on a silicon substrate (not shown). An insulating film is provided on a top layer of base 20. As shown in FIG. 9A, first stop insulating layer 31, first interlayer insulating layer 27, and second stop insulating layer 32 are formed in this order on base 20. First interlayer insulating layer 27 is made of a silicon nitride film formed by the CVD process.

[Step 2] An opening for use in forming an interconnection is formed in first stop insulating layer 31, first interlayer insulating layer 27, and second stop insulating layer 32 using photolithography technology and etching technology. During the etching, first stop insulating layer 31 serves as an etch stopper for first interlayer insulating layer 27. Third barrier metal 28 and a copper shield layer (not shown) are formed in the resulting opening by the CVD process. The copper shield layer is formed to a thickness of about 20 to 100 nm and small amounts of impurities (e.g., aluminum) are added to the copper shield layer. Then, the copper shield layer is plated with copper by electrolytic plating, where the thickness of copper plating can be about 800 to 1,200 nm.

Figure 9B:
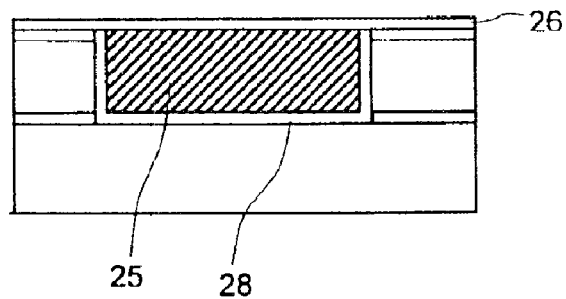
FIG. 9B is a schematic sectional view showing a manufacturing method for the switching element according to example 2.

Next, unnecessary barrier metal and copper deposited in areas other than the opening of second stop insulating layer 32 are polished away by a CMP (chemical mechanical polishing) process to form third electrode 25 as shown in FIG. 9B. Meanwhile, a lower interconnection (not shown) is formed in the same layer as third electrode 25. In the CMP process, second stop insulating layer 32 serves as a CMP stopper.

Furthermore, impurities are diffused over the lower interconnection and third electrode 25 by thermal processing. Thermal processing improves the electromigration resistance of the lower interconnection. The formation method of the lower interconnection and third electrode 25 described here is widely used as an interconnect formation step for semiconductor apparatuses. Next, first anti-diffusion layer 26 of silicon carbonitride is formed to a film thickness of 100 nm on second stop insulating layer 32 using the sputtering process or CVD process (FIG. 9B). Consequently, the top face of third electrode 25 is covered by first anti-diffusion layer 26.

An opening is formed in first anti-diffusion layer 26 using photolithography technology and etching technology. In this case, the opening is a through-hole reaching the top face of third electrode 25.

[Step 3] Copper is deposited in the opening of first anti-diffusion layer 26 using the sputtering process or CVD process, to a thickness equal to or larger than the film thickness of first anti-diffusion layer 26, i.e., 100 nm. Then, unnecessary copper deposited in areas other than the opening is polished away by the CMP process to flatten the top face of copper, thereby merging the copper in the opening with third electrode 25 shown in FIG. 9B. Flattening the top face of third electrode 25 thereby eliminating any elevation provides advantages, including the advantage of being able to apply a photoresist to a uniform film thickness in the subsequent lithography step and to form a film that has a uniform thickness during film formation.

Figure 9C:
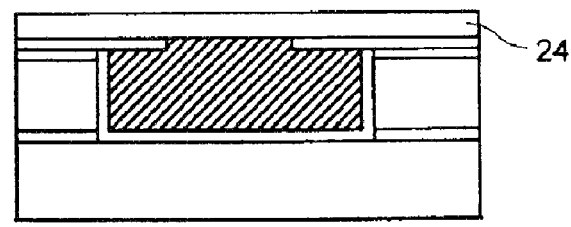
FIG. 9C is a schematic sectional view showing a manufacturing method for the switching element according to example 2.

[Step 4] Second ion-conducting layer 24 made of tantalum oxide is formed to a film thickness of 15 nm on first anti-diffusion layer 26 and third electrode 25 using the sputtering process or CVD process (FIG. 9C).

Figure 9D:
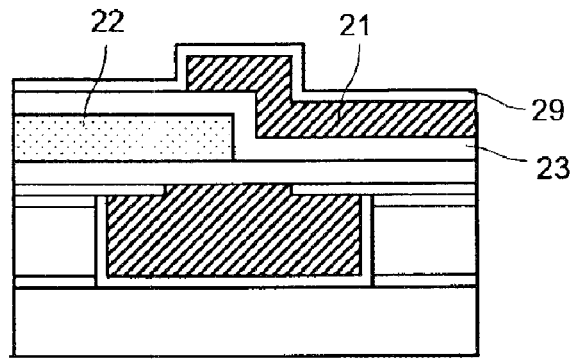
FIG. 9D is a schematic sectional view showing a manufacturing method for the switching element according to example 2.

A film of platinum that is 50 nm thick is formed for second electrode 22 on second ion-conducting layer 24. Second electrode 22 is formed as shown in FIG. 9D by processing the platinum using photolithography technology and etching technology. Next, a film of tantalum oxide that is 15 nm thick is formed as first ion-conducting layer 23 on the exposed surface of second ion-conducting layer 24 and on second electrode 22 using the sputtering process or CVD process.

[Step 5] A film of copper that is 50 nm thick is formed for first electrode 21 on first ion-conducting layer 23. First electrode 21 is formed as shown in FIG. 9D by processing the copper using photolithography technology and etching technology. Subsequently, a film of silicon carbonitride that is 100 nm thick is formed as second anti-diffusion layer 29 on the exposed surface of first ion-conducting layer, 23 and first electrode 21 using the sputtering process or CVD process (FIG. 9D).

[Step 6] Second interlayer insulating layer 30 and third stop insulating layer 33 are formed in sequence on second anti-diffusion layer 29 using the CVD process. An opening for use in forming the plug for first electrode 21 is formed reaching the top face of first electrode 21 by penetrating third stop insulating layer 33, second interlayer insulating layer 30, and second anti-diffusion layer 29, using photolithography technology and etching technology. At the same time, an opening for use in forming the plug for second electrode 22 is formed reaching the top face of second electrode 22 by penetrating third stop insulating layer 33, second interlayer insulating layer 30, second anti-diffusion layer 29, and first ion-conducting layer 23.

Barrier metal and a copper shield layer (not shown) which will be partly merged into copper plating, are formed in the resulting opening by the sputtering process or CVD process. The thickness of the copper shield layer can be about 20 to 100 nm. Then, the copper shield layer is plated with copper by a plating process, where the thickness of copper plating can be about 800 to 1,200 nm. Furthermore, unnecessary barrier metal and copper deposited in areas other than the openings is polished away by the CMP process. In the CMP process, third stop insulating layer 33 serves as a CMP stopper. In this way, first plug 36 whose side faces and bottom face are covered by first barrier metal 35 and second plug 38 whose side faces and bottom face are covered by second barrier metal 37 are formed as shown in FIG. 9E.

Figure 9E:
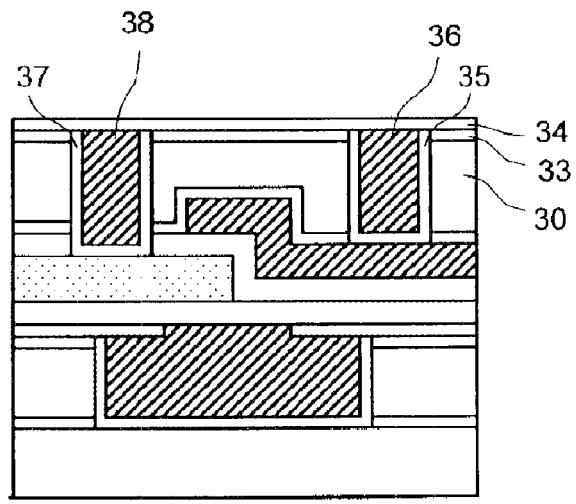
FIG. 9E is a schematic sectional view showing a manufacturing method for the switching element according to example 2.

Furthermore, protective film 34 of silicon carbonitride is formed, as required, to a film thickness of 50 nm on third stop insulating layer 33 by the sputtering process or CVD process (FIG. 9E). Consequently, the top faces of first plug 36 and second plug 38 are covered by protective film 34. Protective film 34 serves to prevent copper diffusion from first plug 36 and second plug 38 during subsequent thermal processing.

The manufacturing method according to the present example allows the shortest distance between any two electrodes to be defined by the film thicknesses of ion-conducting layers. The use of the sputtering process for first ion-conducting layer 23 makes it possible to reduce the bending angle of the sharp portion pointed in the direction from first electrode 21 to second electrode 22.

The present example provides a configuration example in which the switching element according to the present exemplary embodiment is mounted on a semiconductor apparatus, and various other variations are possible. Some of the variations will be described in example 3 and example 4 below.

Example 3

According to the present example, the first plug combines the first electrode in the semiconductor apparatus described in example 2.

Figure 10:
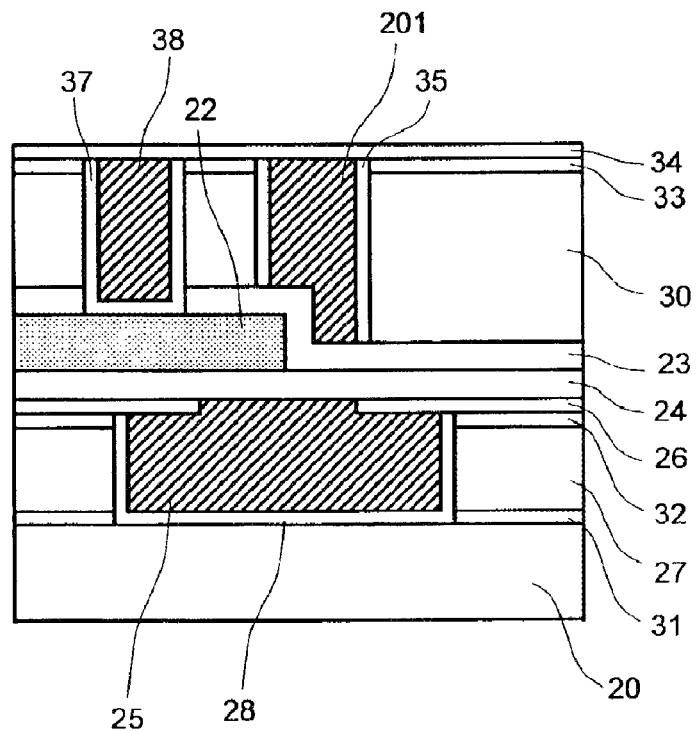
FIG. 10 is a schematic sectional view showing a configuration example of a switching element according to example 3.

A semiconductor apparatus according to the present example will be described. FIG. 10 is a schematic sectional view showing a configuration example of a switching element according to the present example. Detailed description of the same components as those in example 2 will be omitted.

As shown in FIG. 10, the present example does not include first electrode 21 shown in FIG. 8. Instead, first plug 201 is formed in such a way as to cover the elevated portion in first ion-conducting layer 23. The side face of first plug 201 is covered by first barrier metal 35 and the bottom face is placed in contact with first ion-conducting layer 23. First plug 201 combines the role of a first electrode. Therefore, the material of first electrode 21 described in example 2 is used for first plug 201.

Next, a manufacturing method for the switching element of the semiconductor apparatus according to the present example will be described. Incidentally, detailed description of parts in common with examples 1 and 2 will be omitted.

In the present example, among the steps described in example 2, [Step 5] and [Step 6] are changed to [Step 5'] and [Step 6'], respectively, as follows.

[Step 5'] Second interlayer insulating layer 30 and third stop insulating layer 33 are formed in sequence on first ion-conducting layer 23 using the CVD process. An opening for use in forming first plug 201 is formed reaching the top face of first ion-conducting layer 23 penetrating second interlayer insulating layer 30 and third stop insulating layer 33, using photolithography technology and etching technology. Barrier metal is deposited on the bottom face and side faces of the resulting opening using the sputtering process or CVD process. Next, the barrier metal deposited on the bottom face of the opening is removed by anisotropic etching, leaving barrier metal 35 shown in FIG. 10. By anisotropic etching, barrier metal deposited on third stop insulating layer 33 is etched as well.

Next, using the sputtering process or CVD process, a copper shield layer (not shown) is formed in the opening whose side faces are covered with barrier metal. The thickness of the copper shield layer can be about 20 to 100 nm. Then, the copper shield layer is plated with copper by a plating process, where the thickness of copper plating can be about 800 to 1,200 nm. Unnecessary copper deposited in areas other than the opening is polished away by the CMP process to form first plug 201 whose side faces are covered by first barrier metal 35. Incidentally, any barrier metal remaining on third stop insulating layer 33 is removed by CMP.

[Step 6'] An opening for use in forming second plug 38 is formed reaching the top face of second electrode 22 penetrating third stop insulating layer 33, second interlayer insulating layer 30, and first ion-conducting layer 23 using photolithography technology and etching technology. Barrier metal and a copper shield layer (not shown)—to be partly merged into copper plating—are formed in the resulting opening by the sputtering process or CVD process. The thickness of the copper shield layer can be about 20 to 100 nm. Then, the copper shield layer is plated with copper by a plating process, where the thickness of copper plating can be about 800 to 1,200 nm. Furthermore, unnecessary barrier metal and copper deposited in areas other than the opening are polished away by the CMP process. In this way, second plug 38 is formed, with the bottom face and side faces of second plug 38 being covered by second barrier metal 37.

Furthermore, protective film 34 of silicon carbonitride is formed, as required, to a film thickness of 50 nm on third stop insulating layer 33 by the sputtering process or CVD process.

The present example structurally eliminates the need for second anti-diffusion layer 29 and eliminates the need for the steps of forming second anti-diffusion layer 29 and first electrode 21 in terms of manufacturing process.

Example 4

According to the present example, the third electrode is made of a material which does not supply metal ions to ion-conducting layers in the semiconductor apparatus described in example 2.

Figure 11:
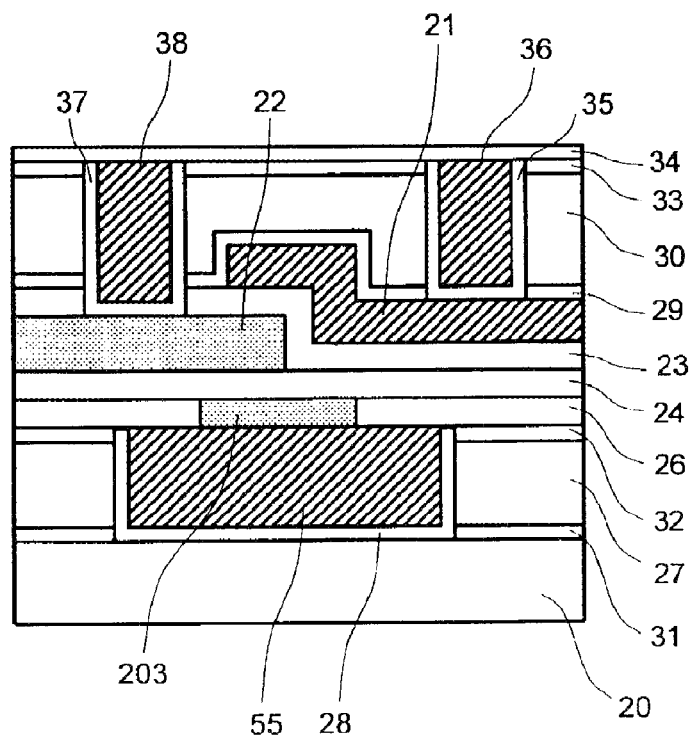
FIG. 11 is a schematic sectional view showing a configuration example of a switching element according to example 4.

A configuration of a semiconductor apparatus according to the present example will be described. FIG. 11 is a schematic sectional view showing a configuration example of a switching element on the semiconductor apparatus according to the present example. Detailed description of the same components as those in example 2 will be omitted.

As shown in FIG. 11, according to the present example, a part which corresponds to third electrode 25 shown in FIG. 8 is made up of third electrode 203 and copper interconnection 55. To provide a lead to third electrode 203, copper interconnection 55 is formed in an opening in first stop insulating layer 31, first interlayer insulating layer 27, and second stop insulating layer 32. Side faces and a bottom face of copper interconnection 55 are covered by third barrier metal 28.

A through-hole is provided in first anti-diffusion layer 26 on second stop insulating layer 32, and third electrode 203 is formed in the through-hole. The undersurface of third electrode 203 is placed in contact with copper interconnection 55 and the top face of third electrode 203 is covered by second ion-conducting layer 24. Third electrode 203 is made of a material which does not supply metal ions to second ion-conducting layer 24.

Next, a manufacturing method for the switching element on the semiconductor apparatus according to the present example will be described. Incidentally, detailed description of parts in common with examples 1 and 2 will be omitted.

In the present example, among the steps described in example 2, third electrode 25 in [Step 2] is replaced by copper interconnection 55 and [Step 3] is changed to [Step 3'] as follows.

[Step 3'] To form third electrode 203, platinum is deposited in the opening in first anti-diffusion layer 26 using the sputtering process or CVD process, to a thickness equal to or larger than the film thickness of first anti-diffusion layer 26, i.e., 100 nm. Then, unnecessary platinum deposited in areas other than the opening is polished away by the CMP process to flatten the top face of platinum. Flattening the top face of third electrode 203 thereby eliminating any elevation provides advantages, including the advantage of being able to apply a photoresist at a uniform film thickness in the subsequent lithography step and to form a film that has a uniform thickness during film formation.

According to the present example, metal ions are supplied only from first electrode 21. For transition from the OFF state to ON state, a voltage is applied between second electrode 22 and first electrode 21, causing the switching element to operate as shown in FIG. 5. For transition from the ON state to OFF state, a negative voltage is applied to third electrode 203, allowing current flow to be regulated as shown in FIG. 6.

If platinum or another metal which does not supply metal ions is used for third electrode 203, it is possible to prevent diffusion of metal ions into ion-conducting layers during thermal processing.

Advantages of the present invention include, for example, the advantage of being able to reduce variations in the characteristics of the switching element among production lots.

The present invention has been described above with reference to an exemplary embodiment and examples, but the present invention is not limited to the exemplary embodiment and examples described above. It will be understood by those skilled in the art that various changes can be made to the configuration and details of the present invention without departing from the scope of the present invention.

This application is the National Phase of PCT/JP2008/068581, filed on Oct. 14, 2008, which is based upon and claims the benefit of priority from Japanese Patent Application No. 2007-272699 filed on Oct. 19, 2007, the content of which is incorporated by reference.

What is claimed is:

1. A switching element comprising:
an ion-conducting layer;
a first electrode and a second electrode placed in contact with the ion-conducting layer; and
a third electrode placed in contact with the ion-conducting layer, the third electrode for controlling electrical conductivity between the first electrode and the second electrode, wherein the shortest distance between any two of the first, second, and third electrodes is defined by a film thickness of the ion-conducting layer, wherein the ion-conducting layer includes a first ion-conducting layer and a second ion-conducting layer,
the first ion-conducting layer is provided between the first electrode and the second electrode,
the second ion-conducting layer is provided between the second electrode and the third electrode, and
a film formed by stacking the first ion-conducting layer and the second ion-conducting layer is provided between the first electrode and the third electrode.

2. The switching element according to claim 1, wherein
the second ion-conducting layer is provided on the third electrode,
the second electrode is provided on the second ion-conducting layer, and a part of the second electrode covers a part of the third electrode via the second ion-conducting layer,
the first ion-conducting layer covers a top face of the second ion-conducting layer excluding a region of the second electrode and covers a side face and a top face of the second electrode, and
the first electrode is provided on the first ion-conducting layer, a part of the first electrode covers a part of the second electrode via the first ion-conducting layer, and another part of the first electrode covers another part of the third electrode via the first and second ion-conducting layers.

3. The switching element according to claim 2, wherein
the first ion-conducting layer is made of a film deposited by a sputtering process.

4. The switching element according to claim 2, wherein
a part of the first electrode, that is in contact with the first ion-conducting layer, includes a material which supplies metal ions,
a part of the second electrode, that is in contact with the first and second ion-conducting layers, is made of a material which does not supply the metal ions, and
a part of the third electrode, that is in contact with the second ion-conducting layer, is made of a material which does not supply the metal ions.

5. The switching element according to claim 4, wherein
the material which supplies the metal ions is a metal or alloy containing at least one from among copper, silver, and lead as a major constituent,
the material which does not supply the metal ions is made up of at least one metal from among platinum, aluminum, gold, titanium, tungsten, nickel, palladium, tantalum, chromium, and molybdenum, a nitride made up of at least one metal from among these metals, a silicide made up of at least one metal from among these metals, and an alloy made up of two or more metals from among these metals, and
the material of the first and second ion-conducting layers is a compound of a metal or semiconductor with a chalcogen element such as oxygen, sulfur, selenium, or tellurium.

6. The switching element according to claim 5, wherein
the material which supplies the metal ions is copper, the material which does not supply the metal ions is platinum, and the material of the first and second ion-conducting layers is tantalum oxide.

7. The switching element according to claim 2, wherein
a part of the first electrode, that is in contact with the first ion-conducting layer, includes a material which supplies metal ions,
a part of the second electrode, that is in contact with the first and second ion-conducting layers, is made of a material which does not supply the metal ions, and
a part of the third electrode, that is in contact with the second ion-conducting layer, includes a material which supplies the metal ions.

8. The switching element according to claim 7, wherein
the material which supplies the metal ions is a metal or alloy containing at least one from among copper, silver, and lead as a major constituent,
the material which does not supply the metal ions is made up of at least one metal from among platinum, aluminum, gold, titanium, tungsten, nickel, palladium, tantalum, chromium, and molybdenum, a nitride made up of at least one metal from among these metals, a silicide made up of at least one metal from among these metals, and an alloy made up of two or more metals from among these metals, and the material of the first and second ion-conducting layers is a compound of a metal or semiconductor with a chalcogen element such as oxygen, sulfur, selenium, or tellurium.

9. The switching element according to claim 8, wherein the material which supplies the metal ions is copper, the material which does not supply the metal ions is platinum, and the material of the first and second ion-conducting layers is tantalum oxide.

10. A manufacturing method for a switching element which comprises a first ion-conducting layer and a second ion-conducting layer, a first electrode and a second electrode placed in contact with the first ion-conducting layer, and a third electrode placed in contact with the second ion-conducting layer in order to control electrical conductivity between the first electrode and the second electrode, the manufacturing method comprising:

forming the third electrode on a base;

forming the second ion-conducting layer on the third electrode;

forming the second electrode on the second ion-conducting layer, with a part of the second electrode covering a part of the third electrode via the second ion-conducting layer;

forming the first ion-conducting layer which covers a top face of the second ion-conducting layer excluding a region of the second electrode and which covers a side face and a top face of the second electrode; and forming the first electrode on the first ion-conducting layer, with a part of the first electrode covering part of the second electrode via the first ion-conducting layer and with another part of the first electrode covering another part of the third electrode via the first and second ion-conducting layers.

11. The manufacturing method for a switching element according to claim 10, wherein a sputtering process is used to form the first ion-conducting layer.

* * * * *